(12) United States Patent
Ohori et al.

(10) Patent No.: US 8,277,893 B2
(45) Date of Patent: Oct. 2, 2012

(54) CHEMICAL VAPOR DEPOSITION APPARATUS

(75) Inventors: Tatsuya Ohori, Tokyo (JP); Kazushige Shiina, Tokyo (JP); Yasushi Iyechika, Chiba (JP); Noboru Suda, Aichi (JP); Yukichi Takamatsu, Kanagawa (JP); Yoshiyasu Ishihama, Kanagawa (JP); Takeo Yoneyama, Kanagawa (JP); Yoshinao Komiya, Kanagawa (JP)

(73) Assignee: Japan Pionics Co., Ltd., Tokyo (JP)

( * ) Notice: Subject to any disclaimer, the term of this patent is extended or adjusted under 35 U.S.C. 154(b) by 444 days.

(21) Appl. No.: 12/497,428

(22) Filed: Jul. 2, 2009

(65) Prior Publication Data
US 2009/0269938 A1 Oct. 29, 2009

Related U.S. Application Data

(62) Division of application No. 11/514,927, filed on Sep. 5, 2006, now abandoned.

(30) Foreign Application Priority Data

Sep. 5, 2005 (JP) ................................ 2005-256001

(51) Int. Cl.
  *C23C 16/06* (2006.01)
(52) U.S. Cl. .............. 427/255.394; 427/248.1; 427/569; 427/585; 427/591; 427/592; 118/504; 118/715
(58) Field of Classification Search .................. 427/585, 427/591, 592, 255.394, 248.1, 569; 118/504, 118/715
See application file for complete search history.

(56) References Cited

U.S. PATENT DOCUMENTS

| | | | |
|---|---|---|---|
| 5,624,499 A | 4/1997 | Mizuno et al. | |
| 6,143,477 A | 11/2000 | Rhieu | |
| 6,254,687 B1 | 7/2001 | Takahashi | |
| 6,435,869 B2 * | 8/2002 | Kitamura | 432/253 |
| 6,559,424 B2 * | 5/2003 | O'Carroll et al. | 219/390 |
| 2001/0021593 A1 * | 9/2001 | Sakai et al. | 438/784 |
| 2003/0140853 A1 * | 7/2003 | Wada et al. | 118/715 |
| 2003/0186517 A1 | 10/2003 | Takagi | |

(Continued)

FOREIGN PATENT DOCUMENTS

EP 1 148 151 10/2001

(Continued)

OTHER PUBLICATIONS

Extended European Search Report for Application No. EP 06018282, dated Nov. 7, 2007.

*Primary Examiner* — Timothy Meeks
*Assistant Examiner* — Elizabeth Burkhart
(74) *Attorney, Agent, or Firm* — Antonelli, Terry, Stout & Kraus, LLP.

(57) ABSTRACT

A chemical vapor deposition apparatus which comprises a susceptor for mounting a substrate thereon, a heater for heating the substrate, a feed gas introduction portion and a reaction gas exhaust portion, wherein a light transmitting ceramics plate held or reinforced by means of a supporting member is equipped between the heater and a mounting position of the substrate. A chemical vapor deposition apparatus that is capable of forming film stably for a long time without giving a negative influence on a quality of semiconductor film even in a case of chemical vapor deposition reaction employing a furiously corrosive gas with an elevated temperature for producing a gallium nitride compound semiconductor or so was realized.

20 Claims, 4 Drawing Sheets

U.S. PATENT DOCUMENTS

| | | | |
|---|---|---|---|
| 2006/0275546 A1* | 12/2006 | Arena et al. | 427/248.1 |
| 2007/0032090 A1 | 2/2007 | Si et al. | |
| 2007/0051316 A1 | 3/2007 | Ohori et al. | |

FOREIGN PATENT DOCUMENTS

| | | |
|---|---|---|
| EP | 1 154 039 | 11/2001 |
| JP | 04-325687 | 11/1992 |
| JP | 05-206100 | 8/1993 |
| JP | 08-017745 | 1/1996 |
| JP | 11-233244 | 8/1999 |
| JP | 2000-277435 | 10/2000 |
| JP | 2003-133225 | 5/2003 |

* cited by examiner (1)　　　　　　　　(2)

(1)　　　　　　　　(2)

(3)　　　　　　　　(4)

CHEMICAL VAPOR DEPOSITION APPARATUS

This application is a Divisional application of application Ser. No. 11/514,927, filed Sep. 5, 2006, and now abandoned, the contents of which are incorporated herein by reference in their entirety.

TECHNICAL FIELD

The present invention relates to a chemical vapor deposition apparatus for a semiconductor film. More particularly, it is concerned with a chemical vapor deposition apparatus for a semiconductor film equipped with a susceptor for mounting a substrate thereon, a heater for heating the substrate, a feed gas introduction portion and a reaction gas exhaust portion.

BACKGROUND ART

There has been a rapid increase in recent years, in demands for a gallium nitride compound semiconductor to be used as a device for a light emitting diode, laser diode, and the like concentrated in the field of illumination. There is known, for instance, as a process for manufacturing a gallium nitride compound semiconductor, a metal-organic chemical vapor deposition (which may be abbreviated as MOCVD below) process in which a semi-conductor film of a gallium nitride compound is subjected to chemical vapor deposition on a substrate of sapphire or the like which has been set in advance in a reactor chamber so as to form an objective film by using, as a group III metal source, an organometallic gas such as trimethylgallium, trimethylindium and trimethylaluminum and by using ammonia as a nitrogen source.

In addition, there is available, as an apparatus for manufacturing the above-mentioned gallium nitride compound semiconductor, a horizontal or a vertical chemical vapor deposition apparatus comprising a horizontal susceptor for mounting a substrate thereon, a heater for heating the substrate, a feed gas introduction portion, a reaction gas exhaust portion, and a rotary axis for supporting the susceptor. The horizontal or the vertical chemical vapor deposition apparatus is of such constitution that the substrate is mounted on the susceptor, the substrate is heated, and thereafter two kinds or more of gases containing a feed gas is supplied in a reactor in the direction parallel or vertical to the substrate so that a semiconductor film is subjected to chemical vapor deposition to form a film on the substrate.

In a process for manufacturing a gallium nitride compound semiconductor, heat resistance and corrosion resistance are required not only for the substrate or the susceptor that will be heated to an elevated temperature but also for the heater itself because the substrate is heated up to 1000° C. or higher together with supplying the corrosive feed gas onto the surface of the substrate. Conventionally, various heaters applicable under an atmospheric corrosive gas with an elevated temperature or a chemical vapor deposition apparatus employing the same have been developed. For example, Japanese Unexamined Patent Application Laid-Open No. Hei 5-206100 discloses an apparatus for manufacturing semiconductors equipped with a heater protected by a quartz tube. Japanese Unexamined Patent Application Laid-Open No. Hei 8-17745 discloses a heater covered by high purity thermally decomposable graphite and a heater covered by silicon carbide. Japanese Unexamined Patent Application Laid-Open No. Hei 11-233244 discloses a hot plate for the CVD apparatus wherein the hot plate comprises three layers of aluminum plate layer having a heater on one surface and reinforcing materials on the other surface. Further, Japanese Patent Laid-Open No. 2003-133225 discloses a heater formed on one surface or inside of a plane plate made of nitride ceramic or carbide ceramic.

However, even the above heater covered with the heat-resistant material or the corrosion-resistant material had a disadvantage of decreasing the effect of covering with the heat-resistant material or the corrosion-resistant material because a difference of a coefficient of thermal expansion between the heat source and the heat-resistant material or the corrosion-resistant material causes deformation and crack of the heater after a repeated use from a room temperature up to a temperature of 1,100 to 1,200° C. Furthermore, in addition to such a situation, because a tough use of the materials under an ambient atmosphere at the temperature of 1,100 to 1,200° C. and 10 to 50% by volume of ammonia gas degrades the materials and breaks the heater in relatively short period, it was necessary to frequently renew the heater.

Additionally, by disposing a quartz plate which transmits heat ray radiated from the heater and which is separated from the heater with a space, it is conceivable to shield the corrosive gas from the heater. However, the quartz plate suffers plastic deformation under the above elevated temperature, and the plastic deformation gradually enlarges with repetitions of heating and cooling, and as a result, for example, the quartz plate hangs down and touches with other component in a reactor chamber. Because it induces a problem of damaging the chemical vapor deposition apparatus, renewing the quarts plate in relatively short period was necessary. Especially in a large-scale apparatus capable of chemical vapor depositing plural of the substrate simultaneously, the problem of plastic deformation of quartz had a tendency of becoming serious because a quartz plate with large size corresponding the scale of the apparatus was necessarily employed.

DISCLOSURE OF THE INVENTION

Under such circumstances, an object of the present invention is to provide a chemical vapor deposition apparatus that is capable of forming film stably for a long time without giving a negative influence on a quality of semiconductor film even in a case of chemical vapor deposition reaction employing a furiously corrosive gas with an elevated temperature for producing a gallium nitride compound semiconductor or so.

As a result of intensive extensive research and investigation made by the present inventors in order to achieve the object, it has been found that disposing a light transmitting ceramics plate such as quartz plate or so held or reinforced by means of a supporting member between the heater and the substrate with a gap facing the heater, and shielding a corrosive gas from the heater will protect the heater from the furiously corrosive gas with an elevated temperature; resultantly completing the chemical vapor deposition apparatus of the present invention.

Namely, the present invention provides a chemical vapor deposition apparatus which comprises a susceptor for mounting a substrate thereon, a heater for heating the substrate, a feed gas introduction portion and a reaction gas exhaust portion, wherein a light transmitting ceramics plate held or reinforced by means of a supporting member is equipped between the heater and a mounting position of the substrate.

PREFERRED EMBODIMENTS TO CARRY OUT THE INVENTION

The present invention is applicable to a chemical vapor deposition apparatus which comprises a susceptor for mounting a substrate thereon, a heater for heating the substrate, a feed gas introduction portion and a reaction gas exhaust portion. The present invention will be applicable to any chemical vapor deposition apparatus of supplying the feed gas from horizontal direction, from upward direction or from downward direction. Additionally, in the MOCVD process blowing the feed gas on a substrate of an elevated temperature, facing a film-forming surface of the substrate downward and supplying the feed gas from downside of the substrate is preferable in a viewpoint of little influence induced by heat convection.

Moreover, the chemical vapor deposition apparatus of the present invention is not particularly limited to any kind of the feed gas, etc. However, working effects of the present invention are sufficiently exhibited in conducting chemical vapor deposition stably for a long time suppressing a breakdown of the heater or so in a case of film-formation of gallium nitride compound semiconductor requiring a temperature of 1,000° C. or higher, or in a case of film-formation of gallium nitride compound semiconductor over plural of substrate.

The chemical vapor deposition apparatus of the present invention will be explained in further detail with reference to FIGS. 1 to 7, which does not limit the scope of the invention.

Figure 1:
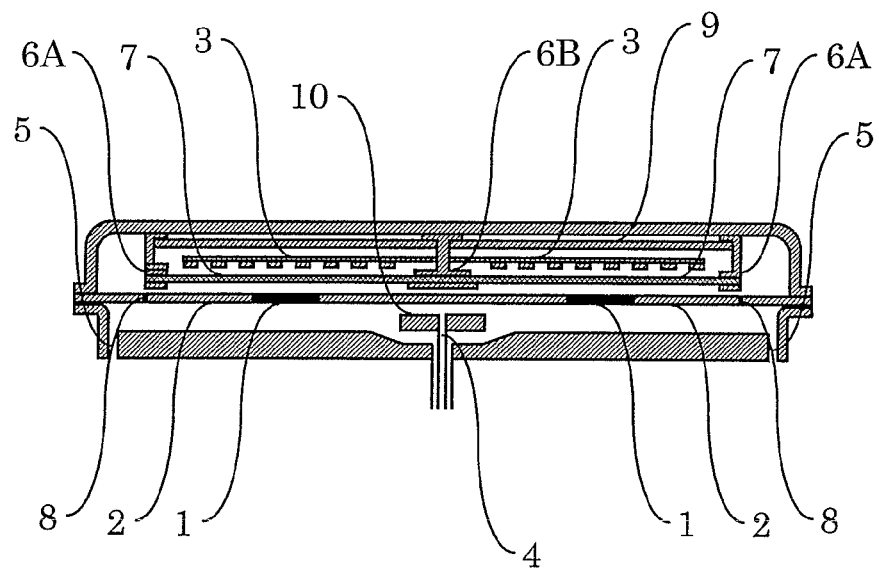
FIG. 1 is a vertical cross-sectional view showing an embodiment of a chemical vapor deposition apparatus according to the present invention.
Figure 2:
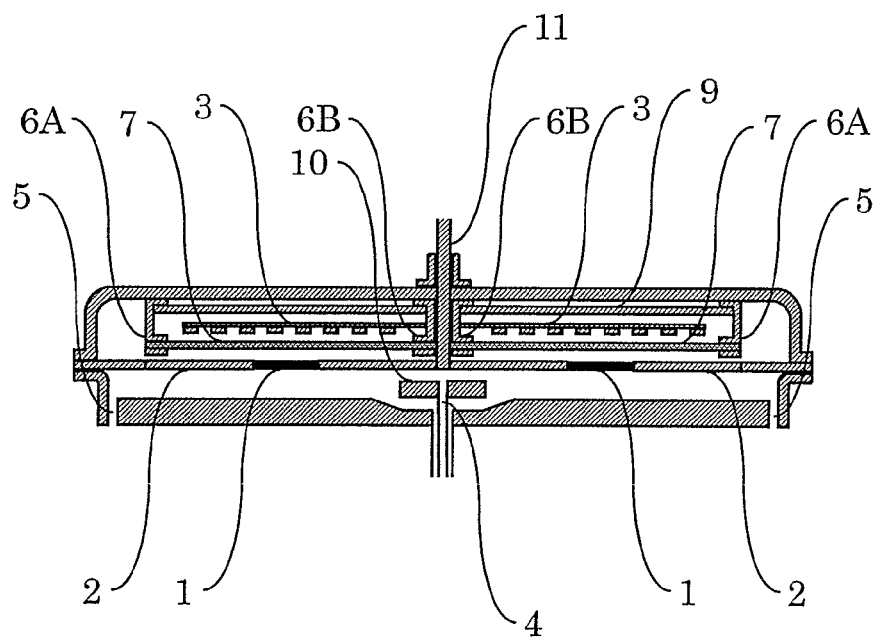
FIG. 2 is a vertical cross-sectional view showing another embodiment of a chemical vapor deposition apparatus according to the present invention.
Figure 3:
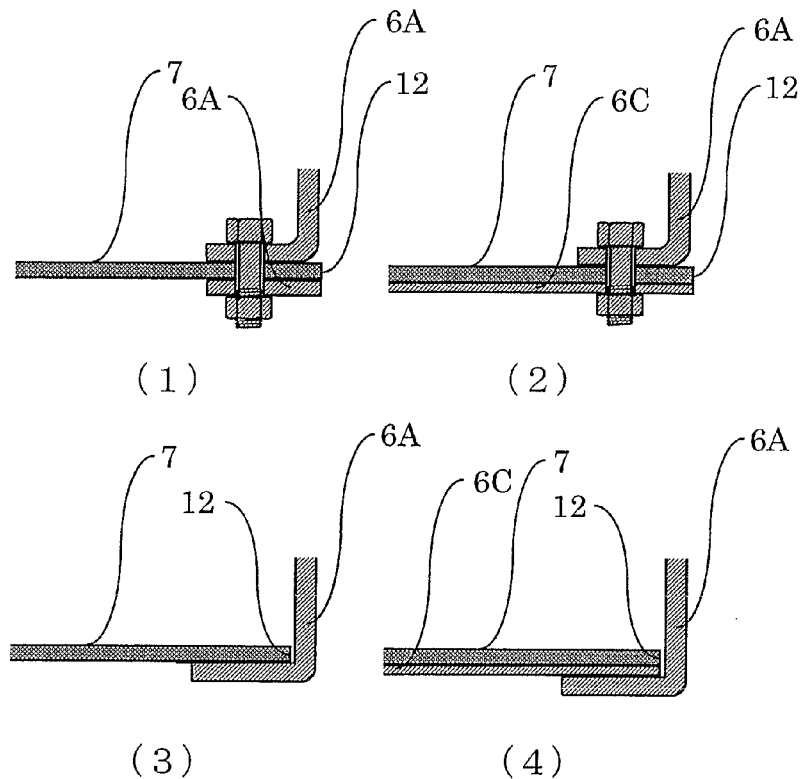
FIG. 3 (1), (2), (3) and (4) are expanded sectional views showing embodiments of the part held by means of a supporting member at an outer peripheral edge or at a peripheral edge of the central hole both of a circular light transmitting ceramics plate.
Figure 4:
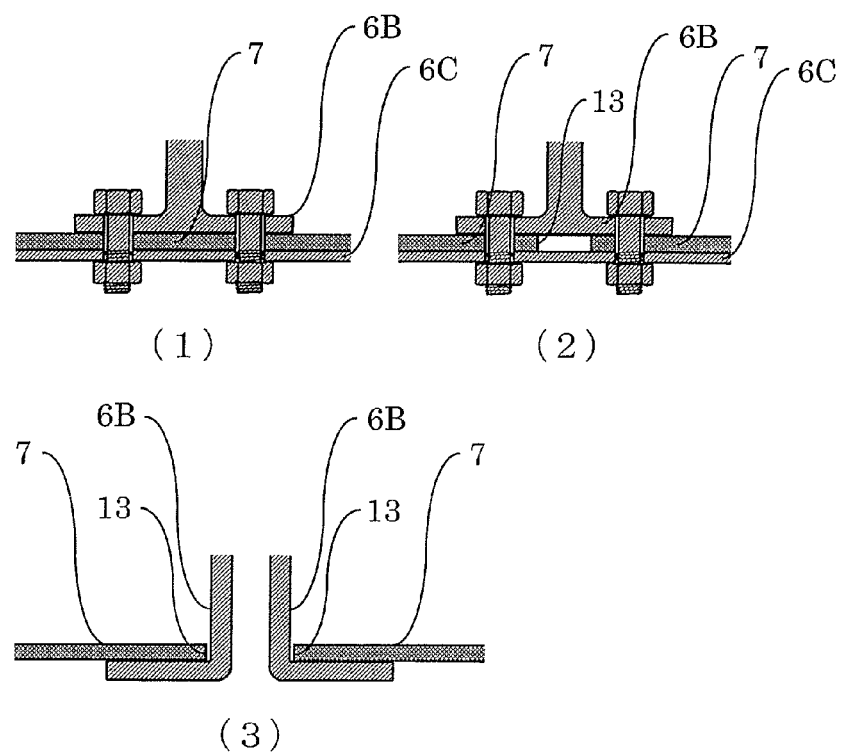
FIG. 4 (1), (2) and (3) are expanded sectional views showing embodiments of the part held by means of a supporting member at a central portion of the circular or discus light transmitting ceramics plate.
Figure 5:
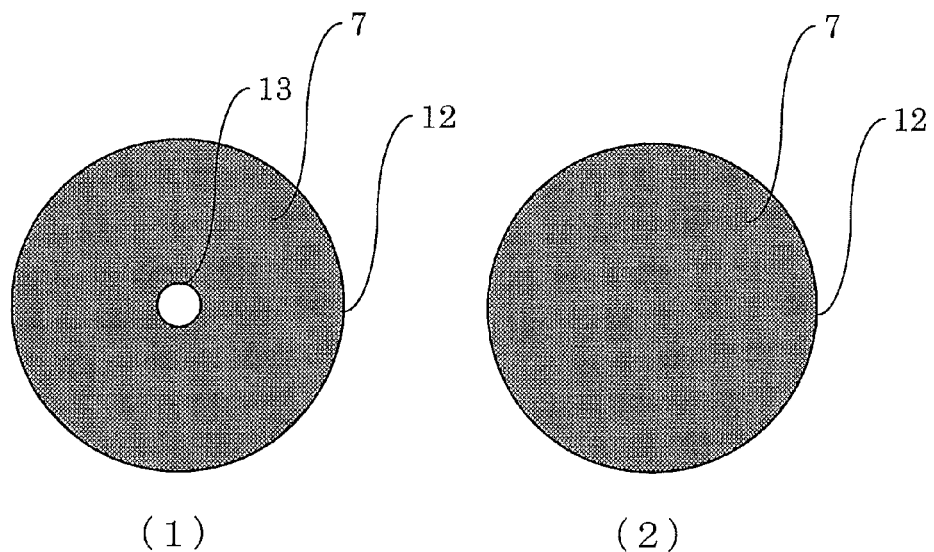
FIG. 5 (1) and (2) are plan views showing embodiments of light transmitting ceramics plates.
Figure 6:
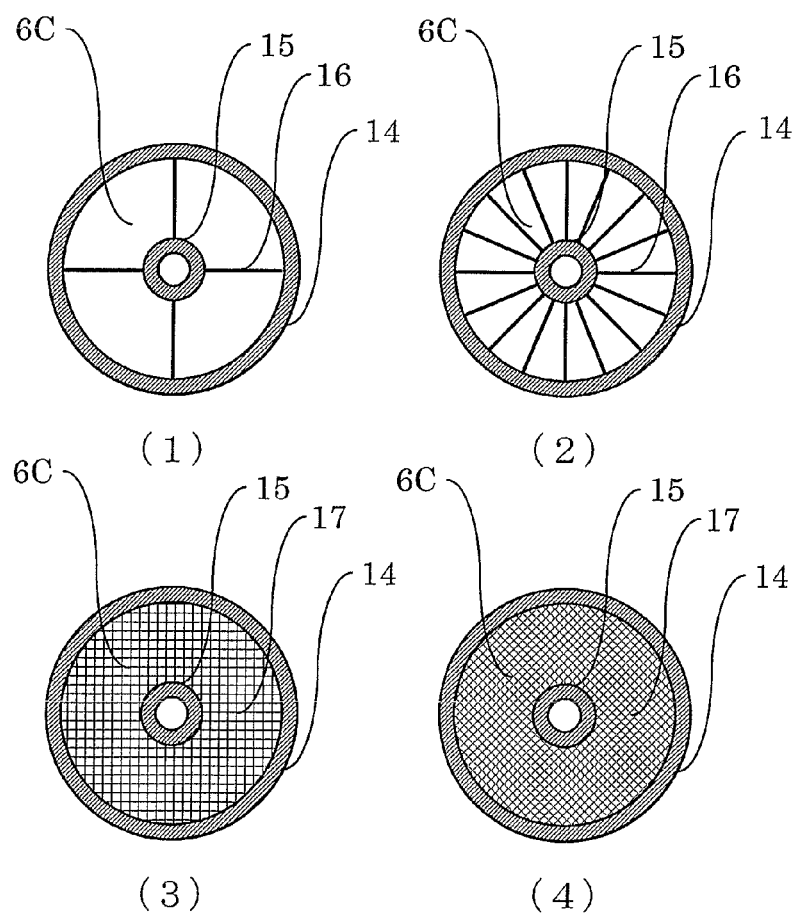
FIG. 6 (1), (2), (3) and (4) are plan views showing embodiments of supporting members for holding or reinforcing the light transmitting member from downsides.
Figure 7:
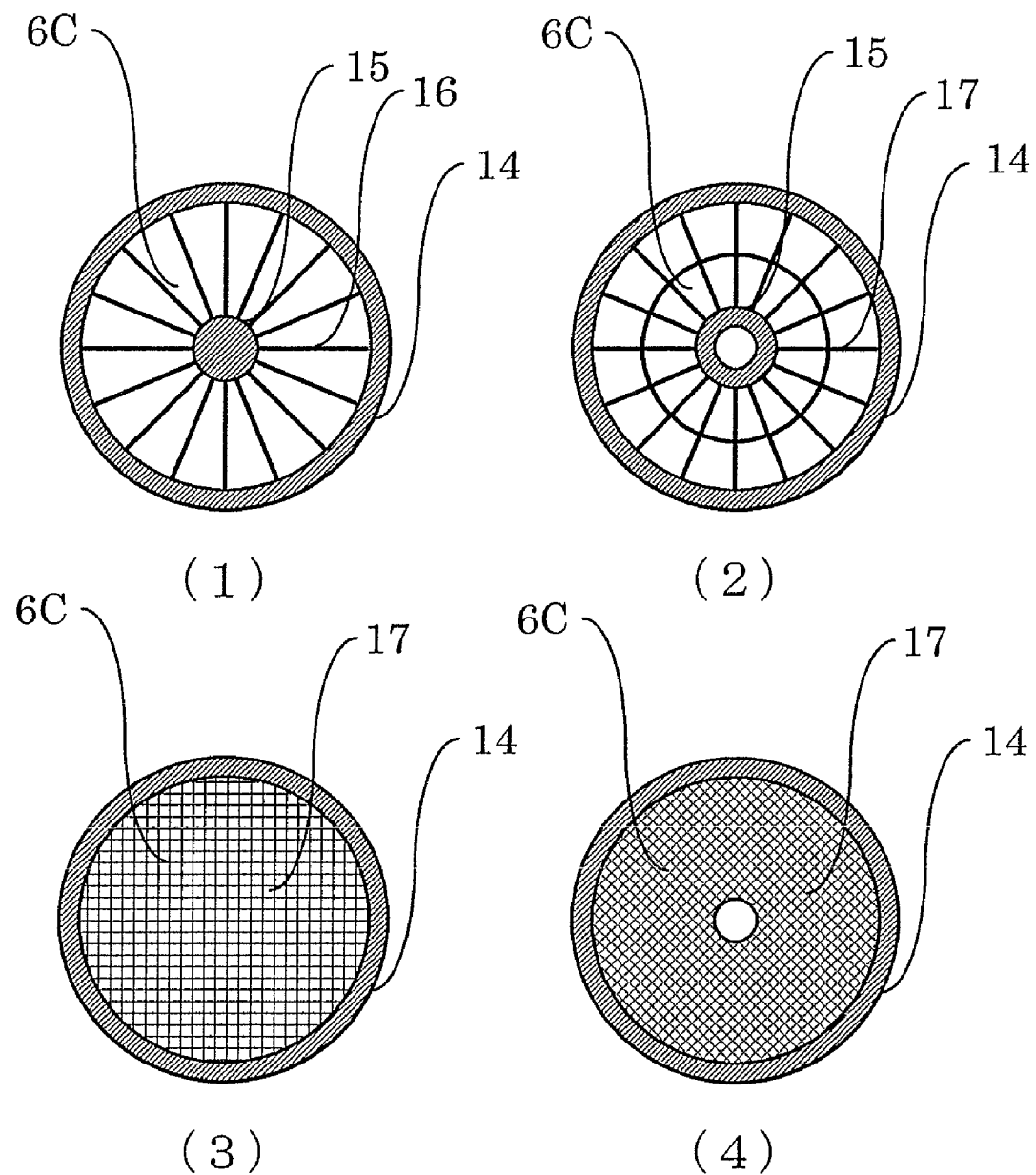
FIG. 7 (1), (2), (3) and (4) are plan views showing other embodiments of supporting members except FIG. 6 for holding or reinforcing the light transmitting member from downsides.

FIGS. 1 and 2 are vertical cross-sectional views showing embodiments of the chemical vapor deposition apparatus according to the present invention. FIG. 3 (1), (2), (3) and (4) are expanded sectional views showing embodiments of the part held by means of a supporting member at an outer peripheral edge or at a peripheral edge of the central hole both of a circular light transmitting ceramics plate in the chemical vapor deposition apparatus of the present invention. FIG. 4 (1), (2) and (3) are expanded sectional views showing embodiments of the part held by means of a supporting member at central portion of the circular or discus light transmitting ceramics plate in the chemical vapor deposition apparatus of the present invention. FIG. 5 (1) and (2) are plan views showing embodiments of light transmitting ceramics plates in the chemical vapor deposition apparatus of the present invention. FIGS. 6 and 7 are plan views showing embodiments of supporting members for holding or reinforcing the light transmitting member from downsides in the chemical vapor deposition apparatus of the present invention.

As shown in FIGS. 1 and 2, the chemical vapor deposition apparatus of the present invention comprises a susceptor 2 for mounting a substrate 1 thereon, a heater 3 for heating the substrate 1, a feed gas introduction portion 4 for supplying the feed gas over the substrate 1 and a reaction gas exhaust portion 5. Between the heater 3 and a mounting position of the substrate 1, a light transmitting ceramics plate 7 held or reinforced by means of at least one of a peripheral edge supporting member 6A or a central portion supporting member 6B each shown in the expanded cross sectional views of FIGS. 3 and 4, preferably held or reinforced by means of a supporting member 6C shown in FIG. 3 (2) or (4) and FIG. 4 (1) or (2) is disposed. Further, as shown in FIG. 1, a gear drive 8 (portions where gears mutually engaging both peripheral edge of the susceptor and a driving gear are disposed) for revolving the susceptor 2, a heat insulator plate 9, a gas guiding member 10 and so on are optionally provided. Additionally, plural of substrates 1 may be mounted on the susceptor 2 as shown in FIGS. 1 and 2. Furthermore, a rotary axis 11 for revolving the susceptor may be provided as shown in FIG. 2 replacing with the gear drive 8 in FIG. 1. In the present invention, the light transmitting ceramics plate 7 is disposed with a gap facing the substrate 1, the susceptor 2 or the heater 3. Further, the light transmitting ceramics plate 7 is disposed so that the feed gas supplied through the feed gas introduction portion 4 or the reaction gas generated after the reaction does not reach onto the surface of the heater 3. Meanwhile, with regard to the conventional chemical vapor deposition apparatus, without light transmitting ceramics plate 7, the feed gas and reaction gas will penetrate through a gap, for example, at an outer periphery of the susceptor 2 revolving, at an outer periphery of the substrate 1 rotating, and so on resultantly reaching onto the heater 3. Additionally, the outer peripheral edge supporting member 6A of the present invention fills a role of supporting the light transmitting ceramics plate 7 at its side, the central portion supporting member 6B fills a role of supporting the light transmitting ceramics plate 7 at its center, and the supporting member 6C fills a role of mainly reinforcing the light transmitting ceramics plate 7 together with a role of supporting it from downside.

In the chemical vapor deposition apparatus of the present invention, the light transmitting ceramics plate 7 is usually circular or discus as shown in FIG. 5, without being limited to however, its contour or configuration of the internal circumference may be quadrangle, pentagon, hexagon, octagon, polygon, etc. When the light transmitting ceramics plate 7 is circular, an outer peripheral edge 12 is partially or entirely held by means of the outer peripheral edge supporting member 6A, or by means of both the outer peripheral edge supporting member 6A and the supporting member 6C as shown, for example, in FIG. 3 as usual, and a peripheral edge 13 of its central hole is partially or entirely held by means of the central portion supporting member 6B, or by means of both the central portion supporting member 6B and the supporting member 6C as shown, for example, in FIG. 4 (2) and (3). Further, when the light transmitting ceramics plate 7 is discus without any hole, the outer peripheral edge 12 is partially or entirely held by means of the outer peripheral edge supporting member 6A, or by means of both the outer peripheral edge supporting member 6A and the supporting member 6C as shown, for example, in FIG. 3 as usual, and its central part is partially or entirely held by means of both the central portion supporting member 6B and the supporting member 6C as shown, for example, in FIG. 4 (1). Additionally, although how to hold the light transmitting ceramics plate 7 with the use of the supporting member is not particularly limited, holding, for example, together with a volt, merely by means of the outer peripheral edge supporting member 6A or by means of the central portion supporting member 6B as shown in FIGS. 3 and 4 is practical.

Further, in examples of the chemical vapor deposition apparatus shown in FIGS. 1 and 2, they have structures surrounding the heater 3 by an insulator plate 9, the light transmitting ceramics plate 7 and the supporting members 6A and 6B. With regards to the structure surrounding the heater, it is preferable to connect an introduction tube introducing an extra inert gas for fulfilling the inner structure with an inert gas. Typical examples of the inert gas include a nitrogen gas, a helium gas, a neon gas, an argon gas, a krypton gas, a xenon gas and a radon gas, while the nitrogen gas is frequently employed as usual. Further, with regards to the structure, it is desirable that a structure having an enhanced sealing property is provided for making a furiously corrosive gas used for film formation hardly invade. Additionally, regarding with the gap between the heater 3 and the light transmitting ceramics plate 7 together with the gap between the light transmitting ceramics plate 7 and the susceptor 2, they are usually 1 to 20 mm, preferably 3 to 15 mm, further preferably 5 to 10 mm. When the gap is in a range of from 1 mm to 20 mm, the heater can be protected from the corrosive gas. When the gap exceeds 20 mm, a heating effect of the heater reduces.

Moreover, although the ceramics plate 7 shown in FIG. 5 is circular and discus, there may be a case where a tremendous temperature distribution generates towards inner facial direction depending on an actual practical situation. In such a situation, a specific value of a coefficient of thermal expansion in the material for the ceramics plate 7 may cause a large elastic deformation, or further cause a breakdown induced by the deformation. For example, when a ceramics plate with a diameter of 600 mm is held at a temperature 1,000° C. higher than a room temperature, and when the coefficient of thermal expansion in the material is $5\times10^{-6}/°$ C., the ceramics plate will expand 3 mm along a direction of its diameter. Accordingly, it is necessary to provide a structure in which an occurrence of such a thermal deformation does not cause any troubles at a portion where the light transmitting ceramics plate 7 is held in the above situation. In order for evading such a problem, it is desirable that the ceramics plate 7 is divided into parts and assembled in a manner that the thermal deformation may be buffered. When the ceramics plate is circular or discus, specific examples of dividing include concentric circular, sectorial, partially or entirely dividing along its circumference after concentric circular divide, partially or entirely dividing along its radius after sectorial divide, etc.

In the chemical vapor deposition apparatus of the present invention shown in FIG. 1, because the light transmitting ceramics plate 7 is fixed in its peripheral portion and in its central portion by means of the supporting members 6A and 6B, a hang down caused by the plastic deformation of the light transmitting ceramics plate can be suppressed as compared with a case where only its outer peripheral edge is held by means of the supporting member. As a result, when a quartz plate is employed as the light transmitting ceramics plate, for example, apprehensions such as a contact with other portion or a breakdown caused by the hang down of the quartz plate will disappear, and a long term stable chemical vapor deposition can be conducted.

In the chemical vapor deposition apparatus of the present invention, when the quartz plate whose thermal deformation is almost negligible is employed as the light transmitting ceramics plate 7, for example, a supporting member (preferably a heat-resistant supporting member) 6C as shown in FIGS. 6 and 7 may be provided under the light transmitting ceramics plate 7 in a manner as shown in FIG. 3 (2) and (4) or FIG. 4 for holding or for reinforcing, resultantly enabling to powerfully suppress the hang down of the light transmitting ceramics plate 7.

Regarding with structures of the supporting member 6C, examples include structures as shown in FIG. 7 (1) and (2), consisting of an outer peripheral part 14, a central part 15 and a coupling part 16 for coupling them or a geometrical coupling part 17, and as shown in FIG. 7 (3) and (4), structures consisting of the outer peripheral part 14 and the geometrical coupling member 17 disposed inside the outer peripheral part 14. The outer peripheral part 14 and the central part 15 mainly fill a role of holding the light transmitting ceramics plate 7 from downside together with a role of reinforcing the ceramics plate 7, and the coupling part 16 or the geometrical coupling part 17 mainly fills a role of suppressing the hang down of the light transmitting ceramics plate 7 caused by its plastic deformation. Additionally, regarding with a shape of the coupling part 16 or the geometrical coupling part 17, typical examples include mesh, radial, spiral, vertical stripe, horizontal stripe and those combination.

Regarding with an outer circumferential configuration of the supporting member 6C, it is usually round fitting with the light transmitting ceramics plate; however, it may be quadrangle, pentagon, hexagon, octagon, polygon and so on without being limited to them. An outer diameter of the supporting member 6C is usually the same as or approximately the same as the outer diameter of the light transmitting ceramics plate 7. Exactly as mentioned above, the supporting member 6C consists of, for example, the outer peripheral part 14, the central part 15 and the coupling part 16 for coupling them or the geometrical coupling part 17. Additionally, it is desirable that the supporting member 6C is also divided into parts and assembled in a manner that the thermal deformation may be buffered similarly as the light transmitting ceramics plate 7. Specific examples of dividing include the same as described about the light transmitting ceramics plate 7 in the foregoing.

In the chemical vapor deposition apparatus of the present invention, silicon oxide (including quartz), alumina, magnesia, yttrium oxide and further, oxide-based ceramics such as $MgAl_2O_4$ or aluminumoxynitride, and nitride-based ceramics such as aluminumnitride or so is employed as a material for composing the light transmitting ceramics plate. However, without specifically limiting to them, any material having heat resistance against the temperature of around 1,200° C., transmitting heat rays radiated from the heater, and having corrosion resistance against the feed gas and the reaction gas is also employable. The thickness of the light transmitting ceramics plate is usually within a range of from about 0.5 to 10 mm, its outer diameter is usually within a range of about 100 to 1,000 mm, and when it has a central hole, the diameter of the central hole is usually within a range of from about 2 to 200 mm.

Further, metals such as carbon steel, manganese steel, chrome steel, molybdenum steel, stainless steel, nickel steel, tungsten steel and further, alloys, metallic oxides, ceramics, carbon, and so on are employed as a material for composing the supporting member.

A heat-resistant material having more superior mechanical strength at a temperature within a range of from 800 to 1,300° C. than the light transmitting ceramics plate 7 is particularly employed for the supporting member 6C. Typical examples of the heat-resistant material for the supporting member include metals such as molybdenum, tungsten or so; heat-resistant alloys such as Inconel or so; metal oxides such as alumina, aluminumoxynitride, magnesia, zirconia or so;

nitride-based ceramics such as boron nitride, silicon nitride, zirconium nitride, titanium nitride, tungsten nitride or so; carbide-based ceramics such as boron carbide, silicon carbide, zirconium carbide, titanium carbide, tungsten carbide, tantalum carbide or so; boride-based ceramics such as nitrogen boride, carbon boride, titanium boride or so; and carbon.

Additionally with regard to the carbon, because there is a case where normal isotropic graphite has not so great corrosion resistance, it is preferable to employ a carbon (pyrolytic carbon) prepared by chemical vapor deposition, a graphite covered with pyrolytic carbon, glassy carbon, a graphite covered with glassy carbon, a graphite covered with tantalum carbide, a graphite covered with silicon carbide, etc. Further, two kinds or more among those in combination may be employable. Moreover, when the supporting member 6C is not light transmitting, it obstruct heat rays radiated from the heater to effectively reach onto the susceptor and accordingly, it is necessary to reduce cross sectional area of the supporting member 6C observed from the heater as small as possible. However on the other hand, the smaller the cross sectional area, the weaker becomes the mechanical strength of the supporting member 6C, resultantly undesirable. When general heat-resistant metals are employed for the supporting member 6C, preferable examples of configuration of reinforcing parts include wire having diameter within a range from 0.5 to 5 mm, or a mesh using the wire. Further, a favorite value about the cross sectional area of the reinforcing parts is, for example, 50% or smaller, preferably 40% or smaller and more preferably 20% or smaller.

By the way, because quartz has very small coefficient of thermal expansion among the light transmitting ceramics, even a large member made of quartz exhibits small thermal elastic deformation and is favorably employed in the present invention.

Regarding with the materials for the supporting member 6C, they are thoroughly classified into favorably light transmitting materials and slightly light transmitting materials. Examples of the former include sapphire, alumina, aluminumoxynitride and so on; and examples of the latter include heat-resistant metals, etc. The heat-resistant metals are tough against thermal bombardment and mechanical shock resultantly employable as the supporting member in the present invention. Furthermore, providing the favorable light transmitting reinforcing member between the supporting member and the light transmitting ceramics plate enables to enhance the reinforcing effect without losing transmission of the heat rays resultantly making it applicable for the present invention. Still further, after such structures are adopted, even when the coefficient of thermal expansion of the light transmitting reinforcing member is not so small, they are preferable because numbers of divided reinforcing member are assembled and further supported by another reinforcing member having slight light transmitting property.

Additionally, although depending on its working temperature and ambient atmosphere, quartz may evaporate at an elevated temperature. For example, using quartz as the light transmitting ceramics and heating it up to about 1,100° C. or more in an atmosphere of hydrogen will cause a case sputtering quartz powder over the surface of the susceptor. In this case, the color of the surface on the heater side of the susceptor changes and its absorption factor about heat rays from the heater varies. As a result, a necessary power for heating the susceptor also varies with passage of time, and accordingly, stable film formation over long term becomes impossible. When any light transmitting ceramics material except quartz is employed together with quartz, it has an effect of suppressing vaporization of quartz resultantly enables to stably form a film for a long term. Therefore, the material except quartz is favorably employed as a specific example in the present invention.

Specific examples of the material for the heater employable in the present invention include metals having high melting point such as molybdenum, tungsten and so on; graphite, heat-resistant and electrically conductive ceramics such as silicon carbide, etc. Because the silicon carbide has subliming ability in a reductive atmosphere at an elevated temperature, when it is heated, it is desirably held in an inert gas ambient atmosphere such as nitrogen, argon, etc. In accordance with the present invention, even a material with low corrosion-resistant property against ammonia at an elevated temperature such as graphite can be employed for the heater. However, covering the heater with an ammonia-resistant material will improve its reliability for an unexpected situation. Specific examples of the ammonia-resistant material suitable for covering graphite employed as the heater include pyrolytic carbon, glassy carbon, tantalum carbide, silicon carbide, etc.

The present invention shall be explained below in further details with reference to examples, but the present invention shall by no means be restricted by the following examples.

Example 1

(Assembly of Chemical Vapor Deposition Apparatus)

Providing a discus susceptor (diameter: 560 mm, thickness: 11 mm), a heater, a feed gas introduction portion, a gas guiding member and a reaction gas exhaust portion inside of a reactor chamber made of stainless steel, and further providing a circular light transmitting ceramics plate (quartz plate) held at its peripheral edge by an outer peripheral edge supporting member 6A (boron nitride) and at its peripheral edge of a central hole by a central portion supporting member 6B (boron nitride), a chemical vapor deposition apparatus as shown in FIG. 1 was assembled. Additionally, regarding with the light transmitting ceramics plate, its diameter was 650 mm, its thickness was 3 mm, and a diameter of its central hole was 32 mm. Further, the light transmitting ceramics plate was supported from downside and reinforced by means of a supporting member 6C as shown in FIG. 6 (3) and composed of a peripheral part (outer diameter: 650 mm, width: 30 mm, thickness: 3 mm) made of carbon, a central part (outer diameter: 62 mm, width: 30 mm, thickness: 3 mm) made of carbon and a coupling part with a mesh structure (spacing: 10 mm) made of molybdenum. Furthermore, the gap between the light transmitting plate and the heater was 7 mm, the gap between the light transmitting plate and the susceptor being also 7 mm.

(Heat Test)

With the use of the chemical vapor deposition apparatus, the following heat test was carried out. Namely, after replacing the atmospheric air in the reactor chamber with nitrogen gas and heating the susceptor so that a thermocouple provided adjacent to the heater up to a temperature of 1200° C., the temperature was maintained for totally 18 hours.

Then, after decreasing the temperature down to a room temperature, a hang down of the light transmitting ceramics plate was measured. As a result, the hang down of the light transmitting ceramics plate was hardly observed and even the maximum value was 1 mm or shorter.

(Corrosion Resistance Test)

Subsequently, after heating the susceptor so that the thermocouple adjacent to the heater up to a temperature of 1200° C., a mixed gas of ammonia gas (20% by volume) and hydrogen gas (80% by volume) was flown into the reactor chamber for 200 hours.

Cooling the temperature down to a room temperature, a surface state of the heater was evaluated by observation. As a result, any damage caused by a corrosive gas (ammonia gas) was not recognized on the surface of the heater covered by boron nitride film.

Examples 2 to 4

Chemical vapor deposition apparatuses were assembled in the same manner as Example 1 except that composing materials for the supporting members 6A and 6B each holding both the outer peripheral edges and the inner peripheral edges of the central holes in the light transmitting ceramics plates were replaced with a pair of stainless and alumina, a pair of stainless and Inconel and a pair of stainless and carbon respectively.

Then, the heat tests were conducted in the same manner as Example 1 except that those chemical vapor deposition apparatuses were employed respectively. As a result, the hangs down of the light transmitting ceramics plate were hardly observed in any of all, and even the maximum value was 1 mm or shorter.

Examples 5 to 8

Chemical vapor deposition apparatuses were assembled in the same manners as Example 1, except that the supporting member 6C for supporting the light transmitting ceramics plate from downside was replaced with those as shown in FIG. 6 (2) (diameter of molybdenum wire: 3 mm), FIG. 6 (4) (spacing of mesh: 10 mm), FIG. 7 (1) (diameter of molybdenum wire: 3 mm), and FIG. 7 (2) (diameter of molybdenum wire: 3 mm) respectively.

Then, the heat tests were conducted in the same manner as Example 1 except that those chemical vapor deposition apparatuses were employed respectively. As a result, the hangs down of the light transmitting ceramics plate were hardly observed in any of all, and even the maximum value was 1 mm or shorter.

Examples 9 to 11

Chemical vapor deposition apparatuses were assembled in the same manners as Example 1 except that composing materials for the coupling part 16 in the supporting member 6C for supporting the light transmitting ceramics plates from downside were replaced with tungsten, Inconel and boron nitride respectively.

Then, the heat tests were conducted in the same manner as Example 1 except that those chemical vapor deposition apparatuses were employed respectively. As a result, the hangs down of the light transmitting ceramics plate were hardly observed in any of all, and even the maximum value was 1 mm or shorter.

Examples 12 to 14

Chemical vapor deposition apparatuses were assembled in the same manners as Example 1 except that composing material for the light transmitting ceramics plate was replaced with sapphire, alumina, aluminumoxynitride respectively.

Then, the heat tests were conducted in the same manner as Example 1 except that those chemical vapor deposition apparatuses were employed respectively. As a result, the hangs down of the light transmitting ceramics plate were hardly observed in any of all, and even the maximum value was 1 mm or shorter.

Example 15

Providing a circular susceptor (diameter: 560 mm, thickness: 11 mm), a heater, a feed gas introduction portion, a gas guiding member and a reaction gas exhaust portion inside of a reactor chamber made of stainless steel, and further providing a circular light transmitting ceramics plate held at its outer peripheral edge by a peripheral edge supporting member 6A and at its inner peripheral edge of a central hole by a central portion supporting member 6B, a chemical vapor deposition apparatus as shown in FIG. 2 was assembled.

Further, the light transmitting ceramics plate was prepared by laminating quartz and sapphire each other (thickness: 1.5 mm each respectively), and it was set in the apparatus placing sapphire at bottom side. The chemical vapor deposition apparatus was completed exactly in the same as Example 1 except the above description. Then, the heat test was conducted in the same manner as Example 1 except that the above chemical vapor deposition apparatus was employed. As a result, the hang down of the light transmitting ceramics plate was hardly observed, and even the maximum value was 1 mm or shorter.

Example 16

Providing a circular susceptor (diameter: 280 mm, thickness: 11 mm), a heater, a feed gas introduction portion, a gas guiding member and a reaction gas exhaust portion inside of a reactor chamber made of stainless steel, and further providing a discus light transmitting ceramics plate (quartz plate) without hole at its center and held at its peripheral edge and at its central portion by means of supporting members 6A and 6B (boron nitride), a chemical vapor deposition apparatus as shown in FIG. 1 was assembled.

Additionally, regarding with the light transmitting ceramics plate, its diameter was 300 mm, its thickness was 5 mm. However, the heat-resistant support member 6C was not used. In addition, a gap between the light transmitting ceramics plate and the heater was 7 mm, and a gap between the light transmitting ceramics plate and the susceptor was also 7 mm.

Then, the heat test was conducted in the same manner as Example 1 except that the above chemical vapor deposition apparatus was employed. As a result, the hang down of the light transmitting ceramics plate was short and even the maximum value was about 1 to 2 mm.

Examples 17 to 19

Chemical vapor deposition apparatuses were assembled in the same manners as Example 16 except that composing material for the light transmitting ceramics plate was replaced with sapphire, alumina, aluminumoxynitride respectively.

Then, the heat tests were conducted in the same manner as Example 1 except that those chemical vapor deposition apparatuses were employed respectively. As a result, the hangs down of the light transmitting ceramics plates were short in any of all, and even the maximum values were about 1 to 2 mm respectively.

Comparative Example 1

A chemical vapor deposition apparatus was assembled in the same manner as Example 1 except that the light transmitting ceramics plate was absent.

With the use of the chemical vapor deposition apparatus, the following corrosion resistance test was carried out. Namely, after heating the susceptor so that the thermocouple adjacent the heater up to a temperature of 1200° C., a mixed gas of ammonia gas (20% by volume) and hydrogen gas (80% by volume) was flown into the reactor chamber for 20 hours.

Cooling the temperature down to a room temperature, a surface state of the heater was evaluated by observation. As a result, it was recognized that on the surface of the heater covered by boron nitride film, a large numbers of minute holes (diameter: around 1 mm) generated under an influence of the corrosive gas (ammonia gas).

Tables 1 and 2 shows conditions and results of the heat tests in Examples 1 to 19. Table 3 shows conditions and results of corrosion resistance test in Example 1 and Comparative Example 1. As verified in the above description, the chemical vapor deposition apparatus whose light transmitting ceramics plate is held by means of the supporting members 6A and 6B in the present invention protects the heater from a corrosive gas without causing great hang down induced by its plastic deformation in the light transmitting ceramics plate even under an elevated temperature. Further, it is also verified that the chemical vapor deposition apparatus of the present invention employing the heat-resistant supporting member 6C together with the supporting members 6A and 6B is capable of regulating the hang down induced by its plastic deformation.

INDUSTRIAL APPLICABILITY

Because the chemical vapor deposition apparatus of the present invention does not employ a structure directly covering the heater with a heat-resistant material or a corrosion-resistant material, there is not any problem in a difference of coefficient of thermal expansion between a composing material of the heat source and the heat-resistant material or the corrosion-resistant material. Further, it has a structure disposing the light transmitting ceramics plate made of quartz or so whose softening point is relatively low between the heater and the substrates, and the ceramics plate is held or reinforced by means of the supporting member. Accordingly, plastic deformation of the ceramics plate at an elevated temperature is almost negligible and as a result, it is possible to reduce a renewal frequency of the ceramics plate tremendously. Therefore, the chemical vapor deposition apparatus of the present invention enables to chemically vapor deposit stably for a long time with good reproduction property suppressing a breakdown of the heater or so even in a case of chemical vapor deposition reaction employing a furiously corrosive gas with an elevated temperature for producing a gallium nitride compound semiconductor or so.

TABLE 1

| | Light transmitting ceramics plate | Supporting member | | Shape | Heat resistant supporting member 6 C | | | Maximum value of hang down (mm) |
| --- | --- | --- | --- | --- | --- | --- | --- | --- |
| | | 6 A | 6 B | | Outer peripheral part | Central part | Coupling part | |
| Example 1 | Quartz | Boron nitride | Boron nitride | FIG. 6(3) | Carbon | Carbon | Molybdenum | <1.0 |
| Example 2 | Quartz | Stainless | Alumina | FIG. 6(3) | Carbon | Carbon | Molybdenum | <1.0 |
| Example 3 | Quartz | Stainless | Inconel | FIG. 6(3) | Carbon | Carbon | Molybdenum | <1.0 |
| Example 4 | Quartz | Stainless | Carbon | FIG. 6(3) | Carbon | Carbon | Molybdenum | <1.0 |
| Example 5 | Quartz | Boron nitride | Boron nitride | FIG. 6(2) | Carbon | Carbon | Molybdenum | <1.0 |
| Example 6 | Quartz | Boron nitride | Boron nitride | FIG. 6(4) | Carbon | Carbon | Molybdenum | <1.0 |
| Example 7 | Quartz | Boron nitride | Boron nitride | FIG. 7(1) | Carbon | Carbon | Molybdenum | <1.0 |
| Example 8 | Quartz | Boron nitride | Boron nitride | FIG. 7(2) | Carbon | Carbon | Molybdenum | <1.0 |
| Example 9 | Quartz | Boron nitride | Boron nitride | FIG. 6(3) | Carbon | Carbon | Tungsten | <1.0 |
| Example 10 | Quartz | Boron nitride | Boron nitride | FIG. 6(3) | Carbon | Carbon | Inconel | <1.0 |
| Example 11 | Quartz | Boron nitride | Boron nitride | FIG. 6(3) | Carbon | Carbon | Boron nitride | <1.0 |
| Example 12 | Sapphire | Boron nitride | Boron nitride | FIG. 6(3) | Carbon | Carbon | Molybdenum | <1.0 |
| Example 13 | Alumina | Boron nitride | Boron nitride | FIG. 6(3) | Carbon | Carbon | Molybdenum | <1.0 |
| Example 14 | Aluminumoxynitride | Boron nitride | Boron nitride | FIG. 6(3) | Carbon | Carbon | Molybdenum | <1.0 |
| Example 15 | Quartz, Sapphire | Boron nitride | Boron nitride | FIG. 6(3) | Carbon | Carbon | Molybdenum | <1.0 |

Notification: In the Tables 1 and 2, 6 A means an outer peripheral edge supporting member and 6 B means a central portion supporting member.

TABLE 2

| | Light transmitting ceramics plate | Supporting member | | Maximum value of hang down (mm) |
| --- | --- | --- | --- | --- |
| | | 6 A | 6 B | |
| Example 16 | Quartz | Boron nitride | Boron nitride | 1~2 |
| Example 17 | Sapphire | Boron nitride | Boron nitride | 1~2 |
| Example 18 | Alumina | Boron nitride | Boron nitride | 1~2 |
| Example 19 | Aluminum-oxynitride | Boron nitride | Boron nitride | 1~2 |

TABLE 3

| | Light transmitting ceramics plate | Time spent for flowing ammonia gas (Hours) | Surface state of the Heater |
| --- | --- | --- | --- |
| Example 1 | Quartz | 200 | No damages |
| Comparative Example 1 | — | 20 | Minute holes generated |

While there has been shown and described what are at present considered the preferred embodiments of the invention, it will be obvious to those skilled in the art that various changes and modification may be made therein without departing from the scope of the invention defined by the appended claims.

What is claimed is:

1. A chemical vapor deposition process for forming a film of a gallium nitride compound semiconductor, comprising:
employing a chemical vapor deposition apparatus comprising a susceptor for mounting a substrate thereon, a heater for heating the substrate, a feed gas introduction portion, and a gas exhaust portion for a reaction gas, wherein a light transmitting ceramics plate held or reinforced by means of a supporting member is equipped between the heater and a mounting position of the substrate, the light transmitting ceramics plate being provided by plural sectorial light transmitting ceramics plates, and a gap between each of the plural sectorial light transmitting ceramics plates and the heater is in the range of from 1 to 20 mm, and introducing a feed gas containing ammonium into said chemical vapor deposition apparatus while introducing an inert gas into said gap, wherein said light transmitting ceramics plate is circular or discus, and divided along its radius to provide said plural sectorial light transmitting ceramics plates.

2. The chemical vapor deposition process according to claim 1, wherein the inert gas is selected from the group consisting of nitrogen gas, helium gas, neon gas, argon gas, krypton gas, xenon gas and radon gas.

3. The chemical vapor deposition process according to claim 1, wherein the inert gas is nitrogen gas.

4. The chemical vapor deposition process according to claim 1, wherein the gap is in a range of 3 to 15 mm.

5. The chemical vapor deposition process according to claim 1, wherein the gap is in a range of 5 to 10 mm.

6. The chemical vapor deposition process according to claim 1, wherein each of said plural sectorial light transmitting ceramics plates transmits heat ray radiated from the heater and shields the heater against the feed gas or the reaction gas.

7. The chemical vapor deposition process according to claim 1, wherein a material for each of said plural sectorial light transmitting ceramics plates is an oxide-based ceramics or nitride-based ceramics.

8. The chemical vapor deposition process according to claim 1, wherein a material for said supporting member is at least one selected from a group consisting of metal, alloy, metal oxide, ceramics and carbon.

9. The chemical vapor deposition process according to claim 1, wherein said susceptor mounts plural of the substrates.

10. The chemical vapor deposition process according to claim 1, wherein each of said plural sectorial light transmitting ceramics plates is supported at its outer peripheral edge and at its central portion.

11. The chemical vapor deposition process according to claim 1, wherein said light transmitting ceramics plate has a hole at its central portion, and wherein its outer peripheral edge and a peripheral of the hole are held by means of the supporting member.

12. The chemical vapor deposition process according to claim 1, wherein said light transmitting ceramics plate is held or reinforced by means of a heat-resistant supporting member from a downside.

13. The chemical vapor deposition process according to claim 12, wherein a material for said heat-resistant supporting member is at least one selected from a group consisting of metal, alloy, metal oxide, nitride-based ceramics, carbide-based ceramics, boride-based ceramics and carbon.

14. The chemical vapor deposition process according to claim 12, wherein said heat-resistant supporting member comprises an outer peripheral part, a central part and a coupling part for the outer peripheral part and the central part.

15. The chemical vapor deposition process according to claim 12, wherein said heat-resistant supporting member comprises an outer peripheral part, a central part and a geometrical part disposed between the outer peripheral part and the central part.

16. The chemical vapor deposition process according to claim 12, wherein said heat-resistant supporting member consists of an outer peripheral part and a geometrical part disposed inside the outer peripheral part.

17. The chemical vapor deposition process according to claim 1, wherein the semiconductor film of a gallium nitride compound semiconductor is formed over the surface of the substrate.

18. The chemical vapor deposition process according to claim 1, wherein the chemical vapor deposition apparatus comprises said light transmitting ceramics plate disposed with a gap facing the heater.

19. The chemical vapor deposition process according to claim 1, wherein said plural sectorial light transmitting ceramics plates are assembled so as to buffer thermal deformation thereof.

20. The chemical vapor deposition process according to claim 1, wherein each of said plural sectorial light transmitting ceramics plates is made of quartz.

* * * * *